US010147876B1

(12) United States Patent
Huang et al.

(10) Patent No.: US 10,147,876 B1
(45) Date of Patent: Dec. 4, 2018

(54) PHASE CHANGE MEMORY ELECTRODE WITH MULTIPLE THERMAL INTERFACES

(71) Applicant: SANDISK TECHNOLOGIES LLC, Plano, TX (US)

(72) Inventors: Lidu Huang, Danville, CA (US); Mac D. Apodaca, San Jose, CA (US); Toshiki Hirano, San Jose, CA (US); Ailian Zhao, Slingerlands, NY (US); Guy Charles Wicker, Southfield, MI (US); Federico Nardi, San Jose, CA (US)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

(21) Appl. No.: 15/693,376

(22) Filed: Aug. 31, 2017

(51) Int. Cl.
  *H01L 45/00* (2006.01)
  *G11C 13/00* (2006.01)
  *H01L 27/24* (2006.01)

(52) U.S. Cl.
  CPC ........ *H01L 45/126* (2013.01); *G11C 13/0004* (2013.01); *H01L 27/2409* (2013.01); *H01L 27/249* (2013.01); *H01L 27/2418* (2013.01); *H01L 45/065* (2013.01); *H01L 45/144* (2013.01); *H01L 45/1683* (2013.01)

(58) Field of Classification Search
  CPC ... H01L 45/06; H01L 45/1253; H01L 45/126; H01L 45/1683
  See application file for complete search history.

(56) References Cited

U.S. PATENT DOCUMENTS

| 7,507,986 B2 | 3/2009 | Lung |
| 7,545,668 B2* | 6/2009 | Philipp ................ H01L 45/06 257/4 |
| 7,872,250 B2 | 1/2011 | Lee |
| 8,084,842 B2 | 12/2011 | Chen |

(Continued)

OTHER PUBLICATIONS

Ahn, et al., "Energy-Efficient Phase-Change Memory with Graphene as a Thermal Barrier," Aug. 25, 2015.
Bozorg-Grayeli, et al., "Temperature-Dependent Thermal Properties of Phase-Change Memory Electrode Materials," IEEE Electron Device Letters, vol. 32, No. 9, Sep. 2011.

(Continued)

*Primary Examiner* — Allison P Bernstein
(74) *Attorney, Agent, or Firm* — Vierra Magen Marcus LLP

(57) ABSTRACT

Systems and methods for providing a phase change memory that includes a phase change material, such as a chalcogenide material, in series with a heating element that comprises multiple thermal interfaces are described. The multiple thermal interfaces may cause the heating element to have a reduced bulk thermal conductivity or a lower heat transfer rate across the heating element without a corresponding reduction in electrical conductivity. The phase change material may comprise a germanium-antimony-tellurium compound or a chalcogenide glass. The heating element may include a plurality of conducting layers with different thermal conductivities. In some cases, the heating element may include two or more conducting layers in which the conducting layers comprise the same electrically conductive material or compound but are deposited or formed using different temperatures, carrier gas pressures, flow rates, and/or film thicknesses to create thermal interfaces between the two or more conducting layers.

18 Claims, 14 Drawing Sheets

(56) References Cited

U.S. PATENT DOCUMENTS

| | | |
|---|---|---|
| 8,106,376 B2 | 1/2012 | Lai |
| 8,173,987 B2 | 5/2012 | Lung |
| 8,233,317 B2 | 7/2012 | Breitwisch |
| 8,293,600 B2 | 10/2012 | Chen |
| 8,987,700 B2 | 3/2015 | Lai |
| 9,087,987 B2 | 7/2015 | Krebs |
| 9,287,498 B2 | 3/2016 | Kau |
| 2008/0054246 A1* | 3/2008 | Sato .................. H01L 27/2436 257/4 |
| 2008/0210923 A1* | 9/2008 | Sato .................. H01L 27/2436 257/4 |
| 2016/0163975 A1 | 6/2016 | Petz |

OTHER PUBLICATIONS

Choi, et al., "Trilayer Tunnel Selectors for Memristor Memory Cells," Adv Mater. 28(2):356-62, Nov. 19, 2015, DOI: 10.1002/adma.201503604.

Govoreanu, et al., "Thin-Silicon Injector (TSI): an All-silicon Engineered Barrier, Highly Nonlinear Selector for High Density Resistive RAM Applications," 2015 IEEE 7th International Memory Workshop, IMW Jul. 2015, DOI: 10.1109/IMW.2015.7150309.

Lu, et al., "Low-power phase change memory with multilayer TiN/W nanostructure electrode," Applied Physics A, Dec. 2014, vol. 117, Issue 4, pp. 1933-1940.

Woo, et al., "Electrical and reliability characteristics of a scaled (~30nm) tunnel barrier selector (W/Ta2O5/TaOx/TiO2/TiN) with excellent performance (JMAX > 107A/cm2)," 2014 Symposium on VLSI Technology, Jun. 2014, DOI: 10.1109/VLSIT.2014.6894431.

\* cited by examiner

PHASE CHANGE MEMORY ELECTRODE WITH MULTIPLE THERMAL INTERFACES

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled in order to reduce the cost per bit. However, as process geometries shrink, many design and process challenges are presented. These challenges include increased variability in memory cell I-V characteristics over process, voltage, and temperature variations and increased leakage currents through unselected memory cells.

DETAILED DESCRIPTION

Figure 1A:
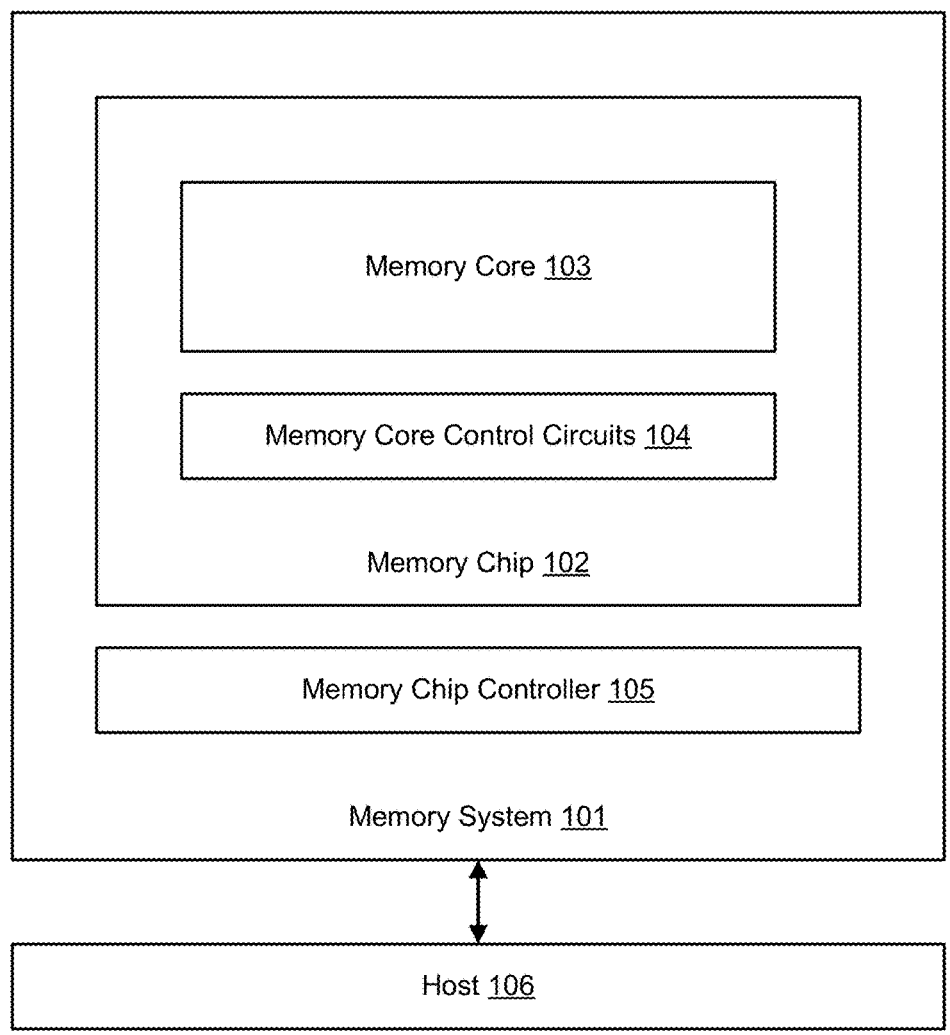
FIGS. 1A-1F depict various embodiments of a memory system.

Technology is described for providing a phase change memory (PCM) that includes a phase change material, such as a chalcogenide material, in series with a heating element (or a heater) that comprises one or more thermal interfaces. The one or more thermal interfaces may cause the heating element to have a reduced bulk thermal conductivity or a lower heat transfer rate across the heating element without a corresponding reduction in electrical conductivity. The phase change material may comprise a germanium-antimony-tellurium compound (GST) or a chalcogenide glass. The heating element may include a plurality of conducting layers with different thermal conductivities. In some cases, the heating element may include two or more conducting layers in which the conducting layers comprise the same electrically conductive material or compound (e.g., titanium nitride or aluminum nitride) but are deposited or formed using different temperatures, carrier gas pressures, flow rates, and/or film thicknesses to create the thermal interfaces between the two or more conducting layers. The reduction in thermal conductivity for the heating element may be caused by the degree of phonon mismatch at the thermal interface created between adjacent conducting layers.

In some embodiments, the heating element may be formed by etching a bottom electrode cavity through a dielectric layer (e.g., a layer of silicon dioxide), depositing a first layer of a plurality of conducting layers within the bottom electrode cavity using a first set of processing conditions, depositing a second layer of the plurality of conducting layers over the first layer within the bottom electrode cavity (e.g., directly abutting or formed on top of the first layer) using a second set of processing conditions different from the first set of processing conditions, and depositing a phase change material over the second layer (e.g., directly abutting or formed on top of the second layer). The deposition conditions may be varied or adjusted in order to create one or more thermal interfaces or thermal barriers that are formed between two layers of the plurality of conducting layers. The varied processing conditions may include different gas content compositions (e.g., the percentage of nitrogen gas), deposition pressures, deposition temperatures, and/or deposition rates. In some cases, a diode or a non-ohmic device (e.g., a metal-insulator-metal diode) may be formed within the bottom electrode cavity below the plurality of conducting layers in order to form a selector device in series with the heating element.

In some embodiments, the two or more conducting layers may include a first conducting layer abutting or directly connected to a second conducting layer. The two conducting layers may be formed or deposited using the same conducting material or the same compound but with different deposition conditions. In one example, the thermal interface between the two conducting layers may be created by stopping and restarting the deposition process, such as physical vapor deposition (PVD), chemical vapor deposition (CVD), atomic layer deposition (ALD), ion beam deposition, or sputter deposition, using deposition machine recipe control. The stopping and restarting of the deposition process will create interruptions in the lattice structures or the crystalline structures between the two conducting layers and form a thermal interface between the two conducting layers. In another example, a first type of deposition process (e.g., PVD) may be used to form the first conducting layer and a second type of deposition process (e.g., ion beam or sputtering) may be used to form the second conducting layer.

In some cases, the first conducting layer may be deposited using a first gas ratio or flow rate and the second conducting layer may be deposited using a second gas ratio or flow rate. In one example, during chemical vapor deposition, machine control may allow different gas flows to be used for each constituent gas. The first conducting layer may be deposited using a first gas ratio for a first gas (e.g., nitrogen gas) and the second conducting layer may be deposited using a second gas ratio for the first gas different from the first gas ratio. In another example, the first conducting layer may be formed using a target with a first atomic percentage of an element (e.g., nitrogen, titanium aluminide, or titanium) and the second conducting layer may be formed using a target with a second atomic percentage of the element different from the first atomic percentage of the element.

In another embodiment, the first conducting layer may be deposited using a metal-nitride, such as titanium nitride or titanium-aluminum-nitride, in which a nitrogen-argon plasma may be used to sputter and react with a metal target to create the metal-nitride. In this case, the nitrogen to argon ratio may be varied via machine recipe control such that the nitrogen content in the film is varied from the first conducing layer to the second conducting layer. For example, the deposition of the first conducting layer may use a first nitrogen to argon ratio and the deposition of the second conducting layer may use a second nitrogen to argon ratio different from the first nitrogen to argon ratio. The smaller atomic size or increased presence of nitrogen in the plasma may cause a layer to layer lattice interface mismatch between the first conducting layer and the second conducting layer.

In some cases, the first conducing layer and the second conducting layer may be deposited via molecular beam epitaxy (MBE) that deposits single layers or mono-layers of a particular metal. Using molecular beam epitaxy, a deposition system may allow deposition from multiple metal sources such that alternating conducting layers of dissimilar atoms may be deposited. In this case, the difference in atomic sizes between the dissimilar metal atoms may form or generate a thermal interface between two of the conducting layers deposited.

In some embodiments, vacuum chamber pressure or deposition temperature may be varied via machine recipe control during deposition of the two conducting layers. The change in pressure or temperature may adjust the mean free path of the deposition material. The difference in mean free path may create a difference in layer density between the two conducting layers, thus creating a lattice dimension mismatch between the two conducting layers and forming a thermal barrier.

A phase change material, such as $Ge_2Sb_2Te_5$, may change phases from an amorphous state (e.g., corresponding with a high resistance reset state) to a crystalline state (e.g., corresponding with a low resistance set state) or from a less-ordered crystalline state to a more-ordered crystalline state. The phase change material may initially be in a crystalline phase, low-resistance state after fabrication. Thereafter, the phase change material may be reset into an amorphous phase, high-resistance state by melting a portion of the phase change material and then quickly quenching the portion of the phase change material by applying a current pulse through the phase change material for a first period of time; the amorphous portion of the phase change material in series with any crystalline region of the phase change material may determine the effective resistance of the phase change material. The phase change material may be arranged in series with or directly abut a heating element (or heater) for heating the portion of the phase change material. A top portion of the phase change material may connect to a top electrode and a bottom portion of the heating element may connect to a bottom electrode. The current passing through the phase change material and entering the heating element may cause a substantial amount of heat to be generated due to current crowding through the heating element. The amount of heat generated may be proportional to the amount of current passing through the heating element. The phase change material may be set into a crystalline phase, low-resistance state by applying a current pulse to the phase change material to anneal the amorphous portion of the phase change material at a temperature between the crystallization temperature for the phase change material and the melting temperature for the phase change material for a second period of time to crystallize the amorphous portion of the phase change material. The second period of time for setting the phase change material may be greater than the first period of time for resetting the phase change material.

One benefit of using a phase change memory that includes a phase change material in series with a heating element that includes two or more conducting layers in which the conducting layers comprise the same electrically conductive material but are deposited or formed using different deposition conditions is that thermal barriers are created at the interfaces between layers of the heating element. These thermal barriers reduce the thermal conductance at the interfaces of the heating element and reduce the reset current required to reset the phase change material. Moreover, the required reset voltage and reset current may also be reduced for the phase change material.

In some embodiments, a memory array may comprise a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading and/or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) memory cells. In other cases, the re-writeable non-volatile memory cells may comprise conductive bridge memory cells or programmable metallization memory cells.

FIG. 1A depicts one embodiment of a memory system 101 and a host 106. The memory system 101 may comprise a non-volatile storage system interfacing with the host (e.g., a mobile computing device or a server). In some cases, the memory system 101 may be embedded within the host 106. As examples, the memory system 101 may comprise a memory card, a solid-state drive (SSD) such a high density MLC SSD (e.g., 2-bits/cell or 3-bits/cell) or a high performance SLC SSD, or a hybrid HDD/SSD drive. As depicted, the memory system 101 includes a memory chip controller 105 and a memory chip 102. The memory chip 102 may include volatile memory and/or non-volatile memory. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit or arranged on a single die. In other embodiments, the memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. In one embodiment, the memory core control circuits 104 and memory core 103 may be arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 may send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

Referring to FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array within the memory core 103. The one or more managing or control circuits may provide control signals to a memory array in order to perform a read operation and/or a write operation on the memory array. In one example, the one or more managing or control circuits may include any one of or a combination of control circuitry, state machines, decoders, sense amplifiers, read/write circuits, and/or controllers. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Figure 1B:
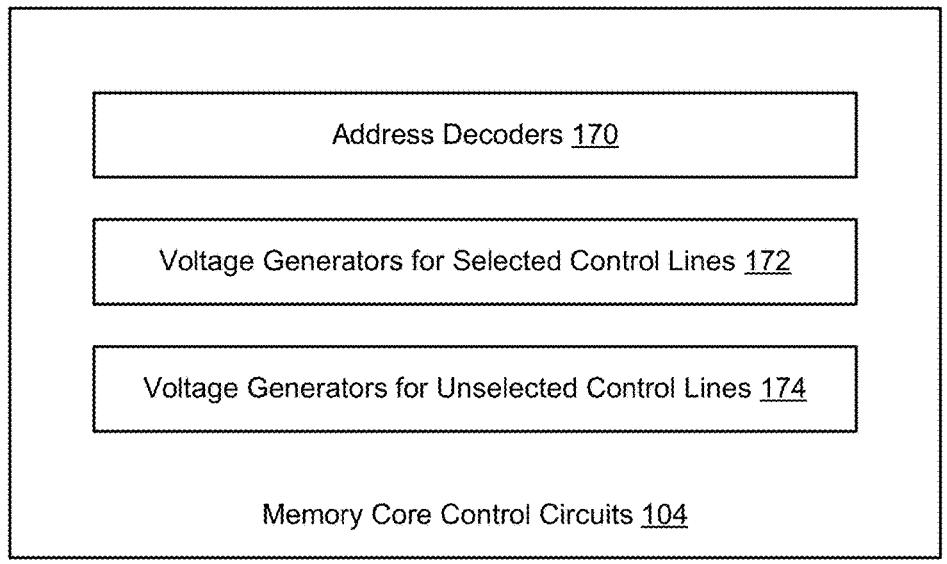

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

Figure 1C:
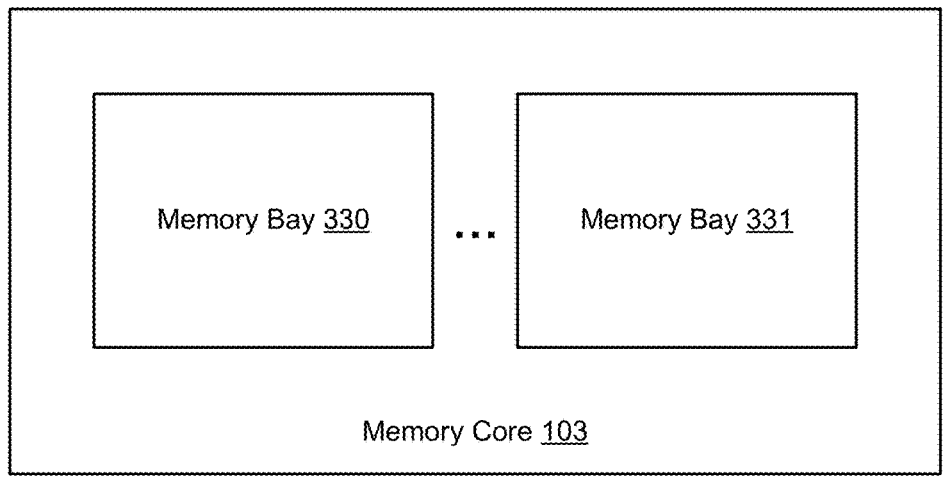

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays or 256 memory bays).

Figure 1D:
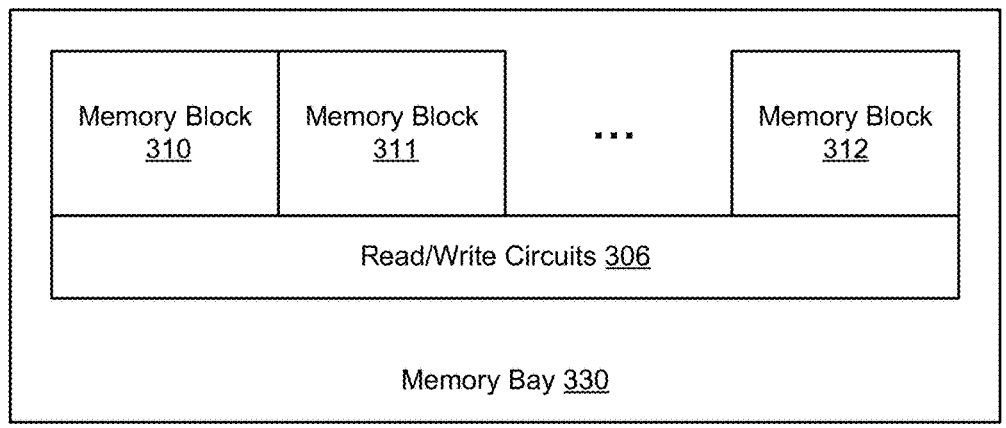

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block may be electrically coupled to read/write circuits 306 at a particular time to avoid signal conflicts.

In some embodiments, read/write circuits 306 may be used to write one or more pages of data into the memory blocks 310-312 (or into a subset of the memory blocks). The memory cells within the memory blocks 310-312 may permit direct over-writing of pages (i.e., data representing a page or a portion of a page may be written into the memory blocks 310-312 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address before performing a write operation to write the set of data to the target address. The memory system 101 may then determine whether a particular memory cell may stay at its current state (i.e., the memory cell is already at the correct state), needs to be set to a "0" state, or needs to be reset to a "1" state. The memory system 101 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells. A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V).

In some cases, read/write circuits 306 may be used to program a particular memory cell to be in one of three or more data/resistance states (i.e., the particular memory cell may comprise a multi-level memory cell). In one example, the read/write circuits 306 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 306 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

Figure 1E:
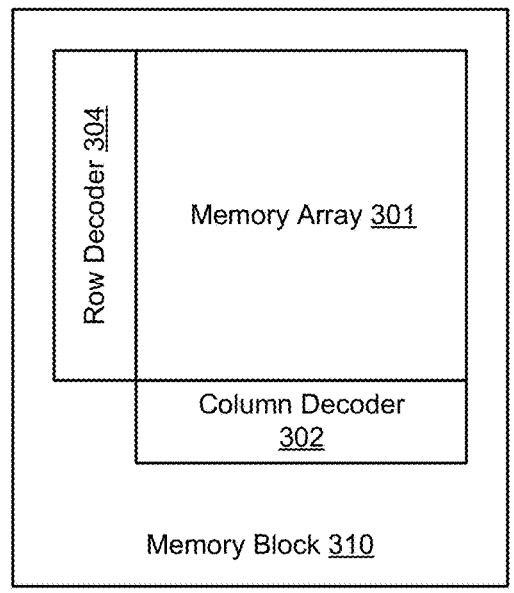

FIG. 1E depicts one embodiment of memory block 310 in FIG. 1D. As depicted, memory block 310 includes a memory array 301, row decoder 304, and column decoder 302. Memory array 301 may comprise a contiguous group of memory cells having contiguous word lines and bit lines. Memory array 301 may comprise one or more layers of memory cells. Memory array 310 may comprise a two-dimensional memory array or a three-dimensional memory array. The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16M memory cells.

Figure 1F:
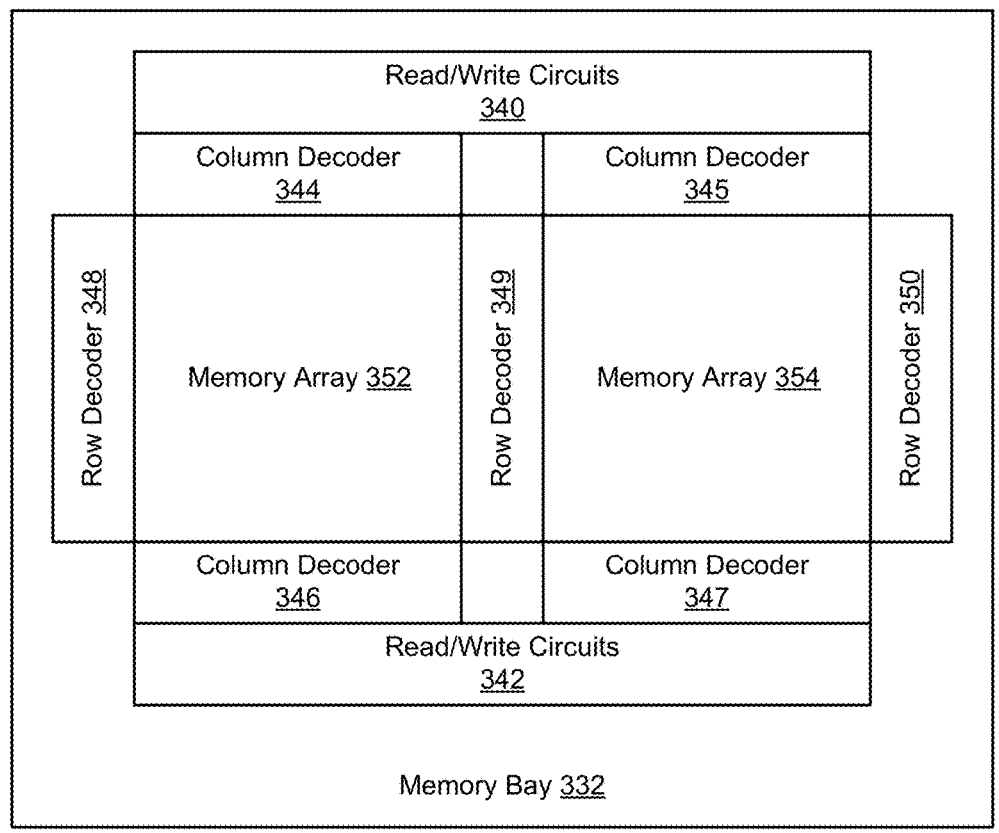

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split may allow for a more efficient layout of the memory bay.

In one embodiment, the memory arrays 352 and 354 may comprise memory layers that are oriented in a horizontal plane that is horizontal to the supporting substrate. In another embodiment, the memory arrays 352 and 354 may comprise memory layers that are oriented in a vertical plane that is vertical with respect to the supporting substrate (i.e., the vertical plane is perpendicular to the supporting substrate). In this case, the bit lines of the memory arrays may comprise vertical bit lines.

Figure 2:
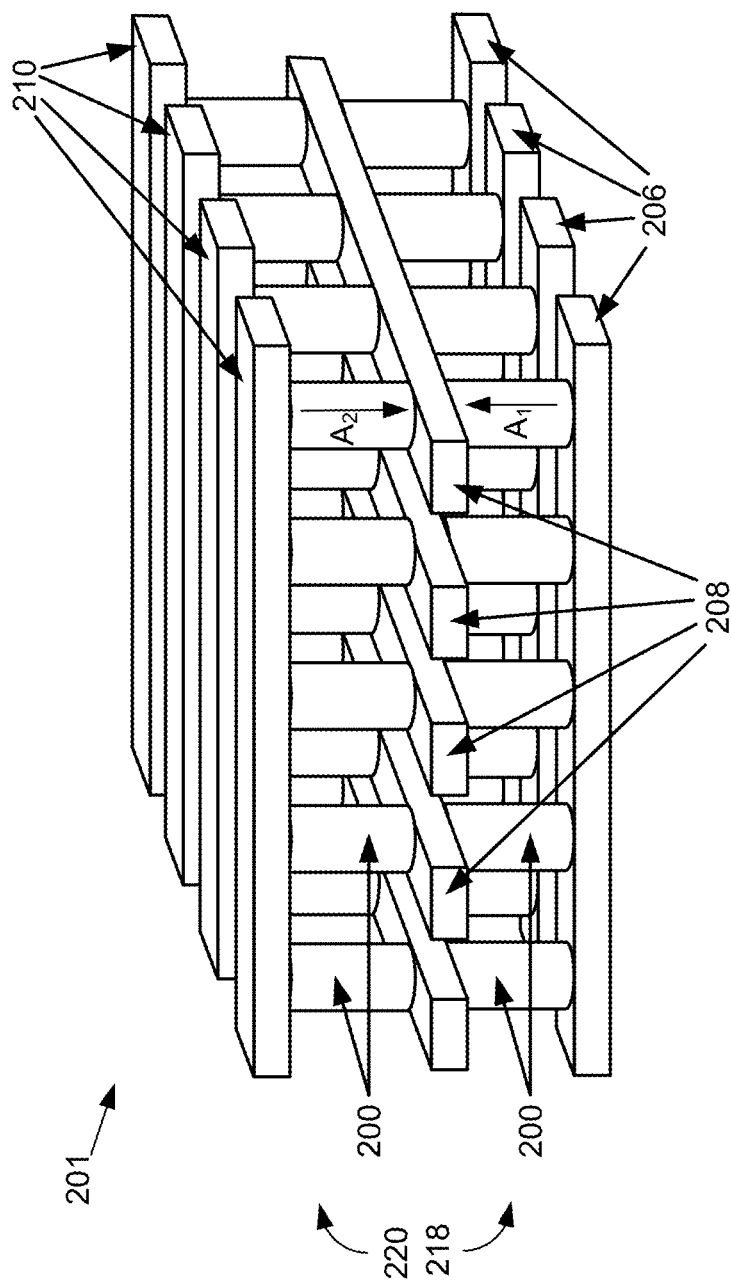
FIGS. 2-3 depict various embodiments of a portion of a three-dimensional memory array.

FIG. 2 depicts one embodiment of a portion of a monolithic three-dimensional memory array 201 that includes a second memory level 220 positioned above a first memory level 218. Memory array 201 is one example of an implementation for memory array 301 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 2, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes a state change element and does not include a steering element. The absence of a diode (or other steering element) from a memory cell may reduce the process complexity and costs associated with manufacturing a memory array.

In one embodiment, the memory cells 200 of FIG. 2 may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a barrier layer comprising germanium or silicon germanium and a metal oxide (e.g., a binary metal oxide). The metal oxide may include titanium oxide, nickel oxide, or hafnium oxide. In some cases, the re-writeable non-volatile memory cells may comprise resistive RAM (ReRAM) devices.

Referring to FIG. 2, in one embodiment of a read operation, the data stored in one of the plurality of memory cells 200 may be read by biasing one of the word lines (i.e., the selected word line) to a selected word line voltage in read mode (e.g., 0V). A read circuit may then be used to bias a selected bit line connected to the selected memory cell to the selected bit line voltage in read mode (e.g., 1.0V). In some cases, in order to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V); however, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line.

Referring to FIG. 2, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "1" and the low-resistivity state may be associated with binary data "0." In other embodiments, SETTING and RESETTING operations and/or the data encoding may be reversed. For example, the high-resistivity state may be associated with binary data "0" and the low-resistivity state may be associated with binary data "1." In some embodiments, a higher than normal programming voltage may be required the first time a reversible resistance-switching element is SET into the low-resistivity state as the reversible resistance-switching element may have been placed into a resistance state that is higher than the high-resistivity state when fabricated. The term "FORMING" may refer to the setting of a reversible resistance-switching element into a low-resistivity state for the first time after fabrication or the resetting of a reversible resistance-switching element into a high-resistivity state for the first time after fabrication. In some cases, after a FORMING operation or a memory cell preconditioning operation has been performed, the reversible resistance-switching element may be RESET to the high-resistivity state and then SET again to the low-resistivity state.

Referring to FIG. 2, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 3:
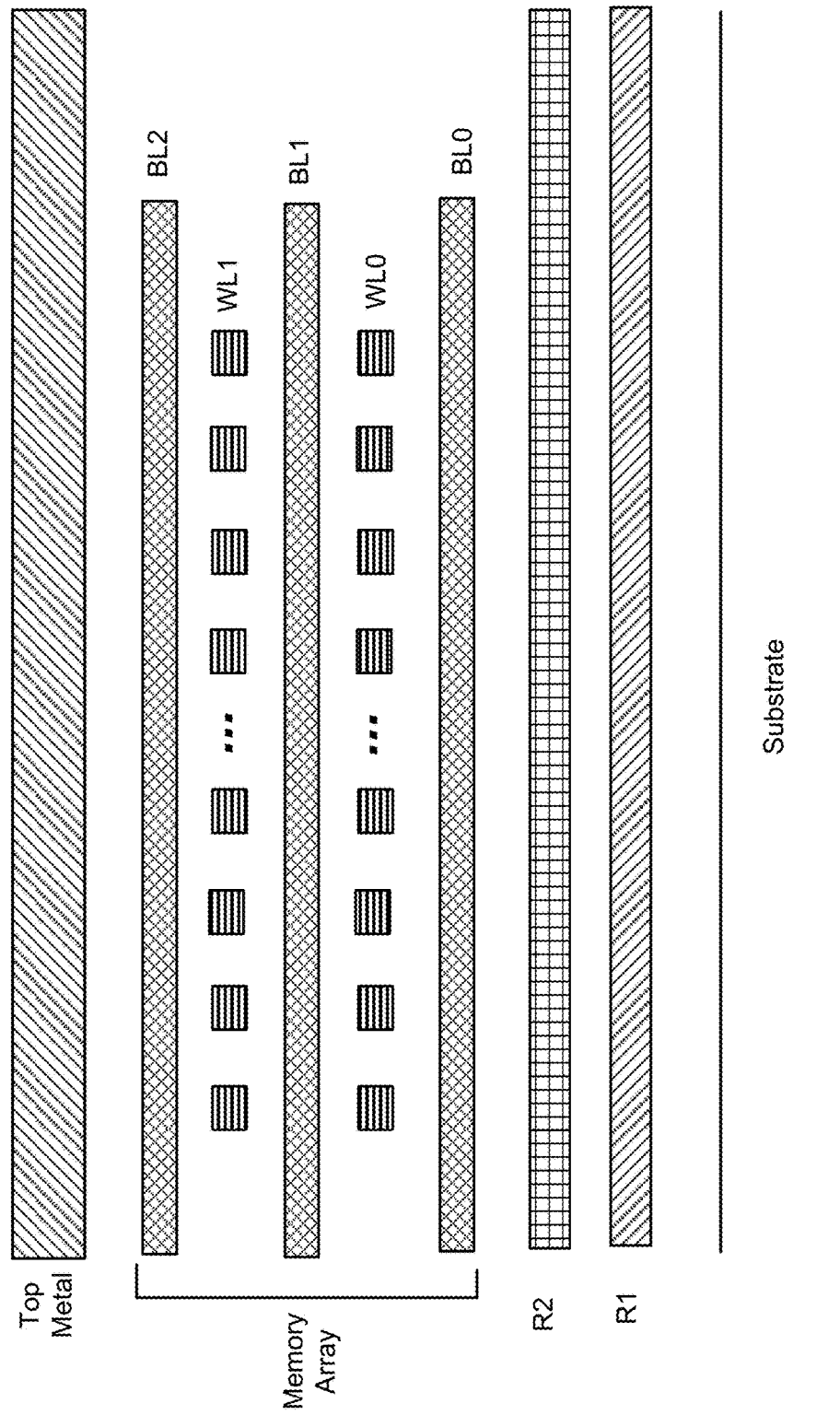

FIG. 3 depicts a subset of the memory array and routing layers of one embodiment of a three-dimensional memory array, such as memory array 301 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 3, two metal layers R1 and R2 may be used for routing layers; however, other embodiments can include more or less than two metal layers. In one example, these metal layers R1 and R2 may be formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 4A:
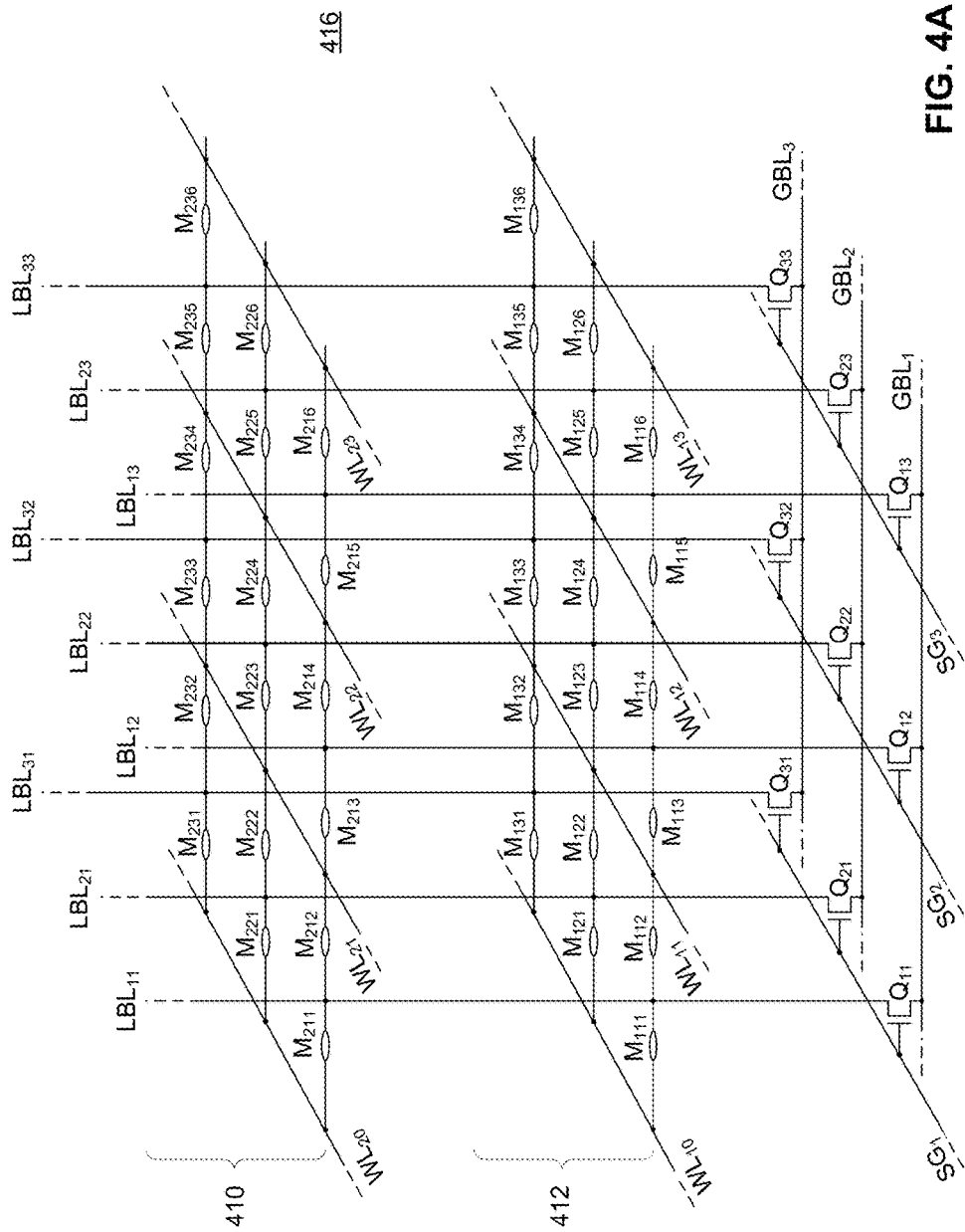
FIGS. 4A-4B depict various embodiments of a portion of a three-dimensional memory array.

FIG. 4A depicts one embodiment of a portion of a monolithic three-dimensional memory array 416 that includes a first memory level 412 positioned below a second memory level 410. Memory array 416 is one example of an implementation for memory array 301 in FIG. 1E. As depicted, the local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). In one example, the particular memory cell may include a floating gate device or a charge trap device (e.g., using a silicon nitride material). In another example, the particular memory cell may include a reversible resistance-switching material, a metal oxide, a phase change material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 4A, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

Figure 4B:
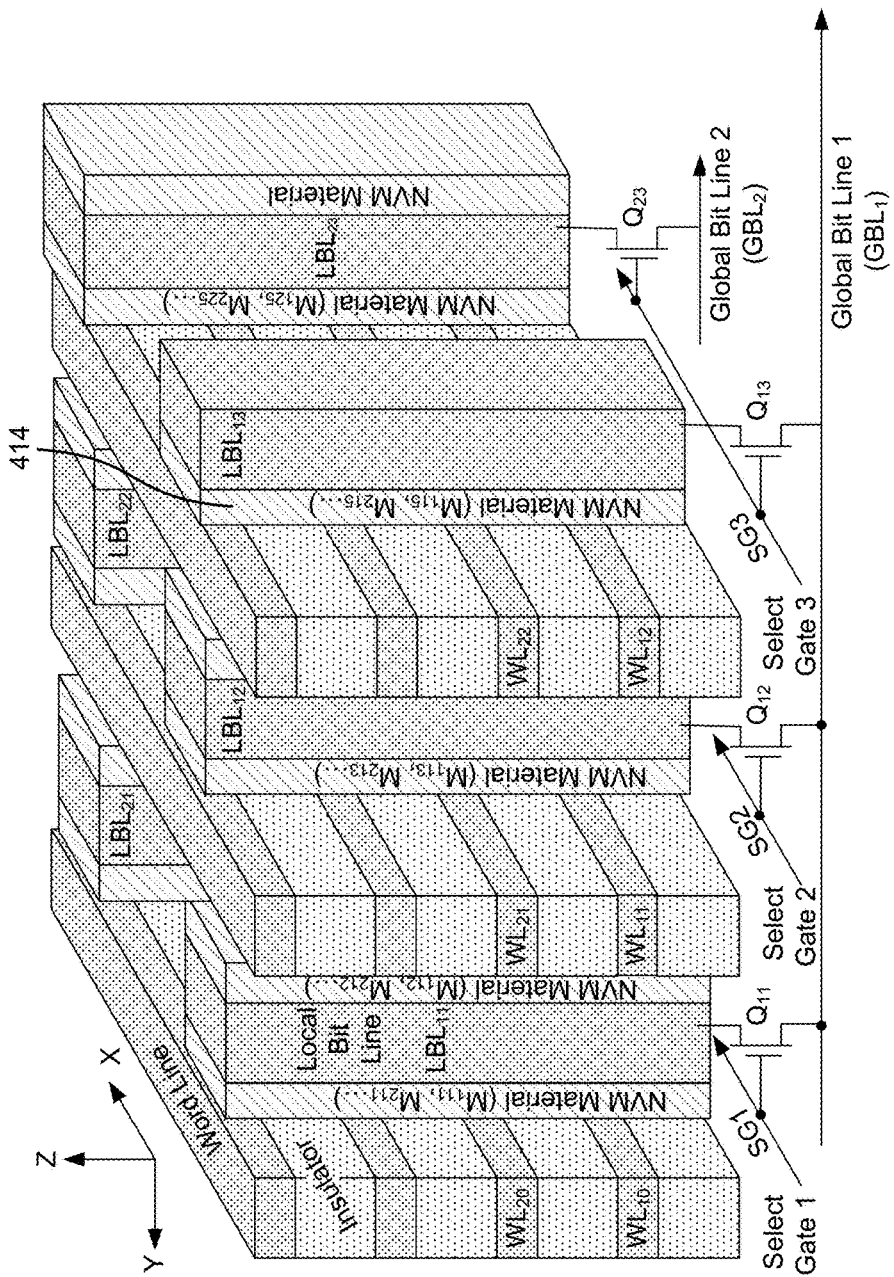

FIG. 4B depicts one embodiment of a portion of a monolithic three-dimensional memory array that includes vertical strips of a non-volatile memory material. The physical structure depicted in FIG. 4B may comprise one implementation for a portion of the monolithic three-dimensional memory array depicted in FIG. 4A. The vertical strips of non-volatile memory material may be formed in a direction that is perpendicular to a substrate (e.g., in the Z direction). A vertical strip of the non-volatile memory material 414 may include, for example, a vertical oxide layer, a vertical metal oxide layer (e.g., titanium oxide, nickel oxide or hafnium oxide), a vertical layer of phase change material, or a vertical charge trapping layer (e.g., a layer of silicon nitride). The vertical strip of material may comprise a single continuous layer of material that may be used by a plurality of memory cells or devices. In one example, portions of the vertical strip of the non-volatile memory material 414 may comprise a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may comprise a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may comprise a MOS device (e.g., an NMOS device) or a vertical thin-film transistor (TFT).

Figure 5:
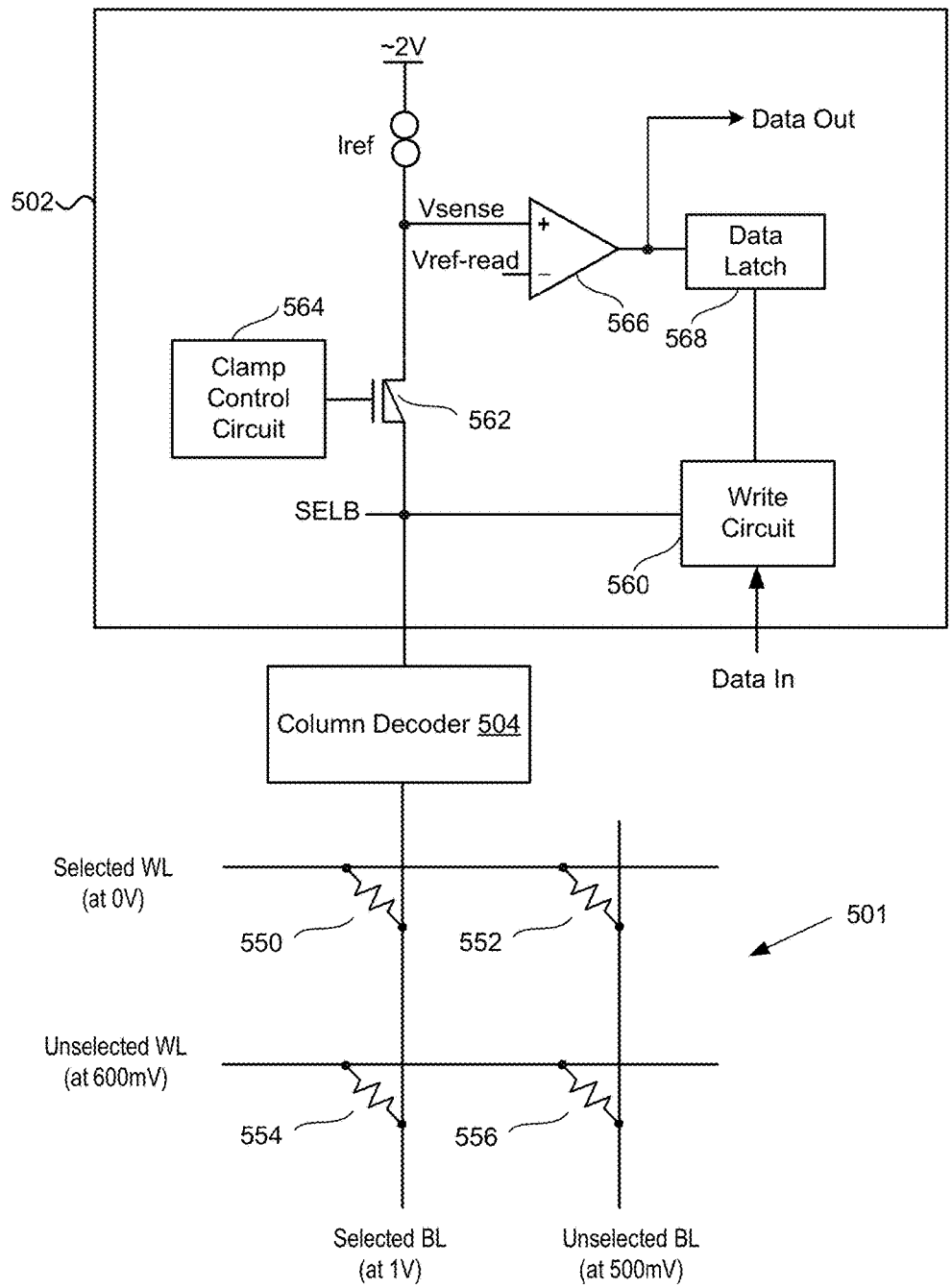
FIG. 5 depicts one embodiment of a read/write circuit.

FIG. 5 depicts one embodiment of a read/write circuit 502 along with a portion of a memory array 501. Read/write circuit 502 is one example of an implementation of read/write circuit 306 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 2. In another embodiment, the portion of a memory array 501 may comprise a memory array with bit lines arranged in a vertical direction that is perpendicular to the substrate, such as memory array 416 in FIG. 4A.

The memory array 501 may include a plurality of phase change memory cells. Each of the memory cells within the memory array 501 may include a phase change material in series with a heating element that comprises at least one thermal interface between two adjacent conducting layers. In one embodiment, the phase change material may comprise a germanium-antimony-tellurium compound and the heating element may include two or more conducting layers in which the conducting layers each comprise the same electrically conductive material or compound (e.g., titanium nitride or aluminum nitride) but are deposited or formed using different deposition techniques, temperatures, carrier gas pressures, flow rates, or layer thicknesses.

As depicted, during a memory array operation (e.g., a programming operation), the selected bit line may be biased to 1V, the unselected word line may be biased to 0.6V, the selected word line may be biased to 0V, and the unselected bit line may be biased to 0.5V. In some embodiments, during a second memory array operation, the selected bit line may be biased to a selected bit line voltage (e.g., 2.0V), the unselected word line may be biased to an unselected word line voltage (e.g., 1.0V), the selected word line may be biased to a selected word line voltage (e.g., 0V), and the unselected bit line may be biased to an unselected bit line voltage (e.g., 1V). In this case, the unselected memory cells sharing the selected word line will be biased to the voltage difference between the selected word line voltage and the unselected bit line voltage. In other embodiments, the memory array biasing scheme depicted in FIG. 5 may be reversed such that the selected bit line is biased to 0V, the unselected word line is biased to 0.4V, the selected word line is biased to 1V, and the unselected bit line is biased to 0.5V.

As depicted in FIG. 5, the SELB node of read/write circuit 502 may be electrically coupled to the selected bit line via column decoder 504. In one embodiment, column decoder 504 may correspond with column decoder 302 depicted in FIG. 1E. Transistor 562 couples (or electrically connects) node SELB to the Vsense node. The transistor 562 may comprise a low VT nMOS device. Clamp control circuit 564 controls the gate of transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the Data In terminal, and data latch 568.

In one embodiment, during a read operation, read/write circuit 502 biases the selected bit line to the selected bit line voltage in read mode. Prior to sensing data, read/write circuit 502 will precharge the Vsense node to 2V (or some other voltage greater than the selected bit line voltage). When sensing data, read/write circuit 502 attempts to regulate the SELB node to the selected bit line voltage (e.g., 1V) via clamp control circuit 564 and transistor 562 in a source-follower configuration. If the current through the selected memory cell 550 is greater than the read current limit, Iref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 may latch the output of sense amplifier 566 after a time period of sensing the current through the selected memory cell (e.g., after 400 ns).

In one embodiment, during a write operation, if the Data In terminal requests a data "0" to be written to a selected memory cell, then read/write circuit 502 may bias SELB to the selected bit line voltage for programming a data "0" in write mode (e.g., 1.2V for a SET operation) via write circuit 560. The duration of programming the memory cell may be a fixed time period (e.g., using a fixed-width programming pulse) or variable (e.g., using a write circuit 560 that senses whether a memory cell has been programmed while programming). If the Data In terminal requests a data "1" to be written, then read/write circuit 502 may bias SELB to the selected bit line voltage for programming a data "1" in write mode (e.g., 0V or −1.2V for a RESET operation) via write circuit 560. In some cases, if a selected memory cell is to maintain its current state, then the write circuit 560 may bias SELB to a program inhibit voltage during write mode. The program inhibit voltage may be the same as or close to the unselected bit line voltage.

Figure 6A:
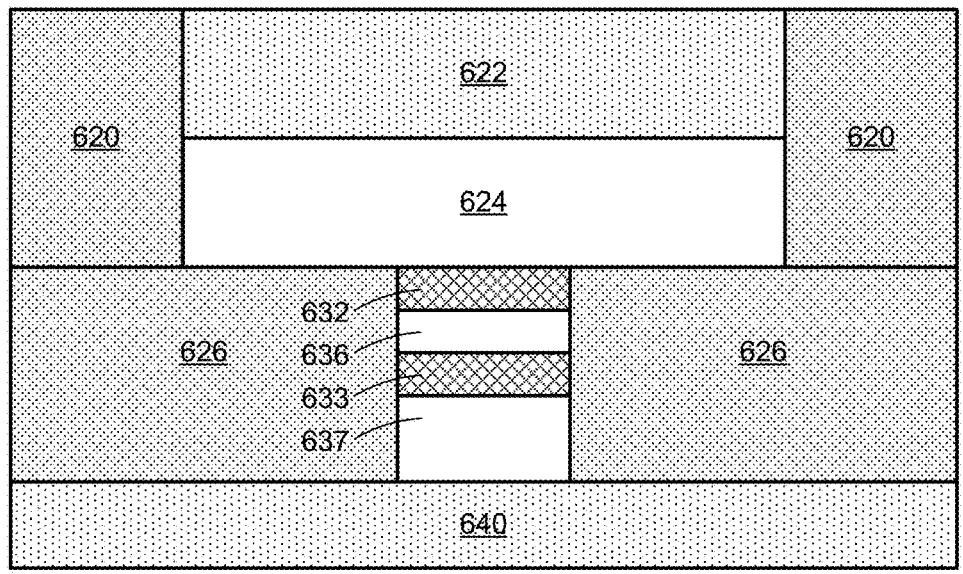
FIGS. 6A-6E depict various embodiments of cross-sectional views of memory structures that include a phase change materials in series with heating elements.

FIG. 6A depicts a cross-sectional view of a memory structure that includes a phase change material 624 in series with a heating element that comprises one or more conducting layers 632-633 and 636-637. The cross-sectional view may comprise a cross-sectional view of a mushroom-type phase change memory cell. The memory structure of FIG.

6A may correspond with a memory cell within a memory array, such as memory array 501 in FIG. 5. As depicted, the heating element includes four conducting layers 632-633 and 636-637; although four conducting layers are depicted, in some cases the heating element may comprise two or more conducting layers. In one example, the two or more conducting layers may be formed in which the conducting layers comprise the same electrically conductive material or compound (e.g., titanium nitride or aluminum nitride) but are deposited using different deposition conditions or process conductions, such as different deposition temperatures, carrier gas pressures, flow rates, and/or film thicknesses. In another example, the two or more conducting layers may comprise a first conducting layer (e.g., titanium nitride) and a second conducting layer that comprises a different conductive material than the first conducting layer (e.g., aluminum nitride).

As depicted in FIG. 6A, a top electrode 622 and the phase change material 624 have been deposited within a first trench of a first width etched within oxide layer 620. The heater comprising the four conducting layers 632-633 and 636-637 have been deposited within a second trench of a second width less than the first width within oxide layer 626. In some cases, the width of the second trench may be less than the width of the first trench. For example, photolithographic techniques may be used to form a heating element that is substantially thinner than the width of the phase change material. One reason to form a narrow heating element is to improve the amount of current crowding through the heating element and to improve the localized heating of the phase change material where the conducting layer 632 abuts the phase change material 624.

The top electrode 622 is directly connected to and abuts the phase change material 624 on a top surface of the phase change material 624. The conducting layer 632 is directly connected to and abuts the phase change material 624 on a bottom surface of the phase change material 624. The conducting layer 632 is directly connected to and abuts conducting layer 636. In one embodiment, the conducting layer 636 may comprise a first layer of titanium nitride and the conducting layer 632 may comprise a second layer of titanium nitride that is deposited above the conducting layer 636. In one example, the conducting layer 632 may be deposited above the conducting layer 636 using a different type of deposition technique; the conducting layer 632 may be deposited using ALD and the conducting layer 636 may be deposited using CVD. In another example, the conducting layer 632 may be deposited above the conducting layer 636 using a different deposition temperature; the conducting layer 632 may be deposited using a first temperature and the conducting layer 636 may be deposited using a second temperature less than the first temperature. In another example, the conducting layer 632 may be deposited above the conducting layer 636 by stopping and restarting the deposition process. The conducting layer 636 may be deposited to have a first layer thickness and the conducting layer 632 may be deposited to have a second layer thickness less than the first layer thickness.

As depicted in FIG. 6A, the conducting layer 632 has been formed above conducting layer 636 that has been formed above conducting layer 633 that has been formed above conducting layer 637. A bottom portion of the conducting layer 637 is directly connected to or abuts bottom electrode 640. The oxide layers 620 and 626 may comprise silicon dioxide. The top electrode 622 and the bottom electrode 640 may comprise tungsten. The phase change material 624 may comprise GST or a chalcogenide glass. Each of the conducting layers of the four conducting layers 632-633 and 636-637 may comprise the same metallic compound or the same metal-nitride, such as titanium nitride or aluminum nitride.

Figure 6B:
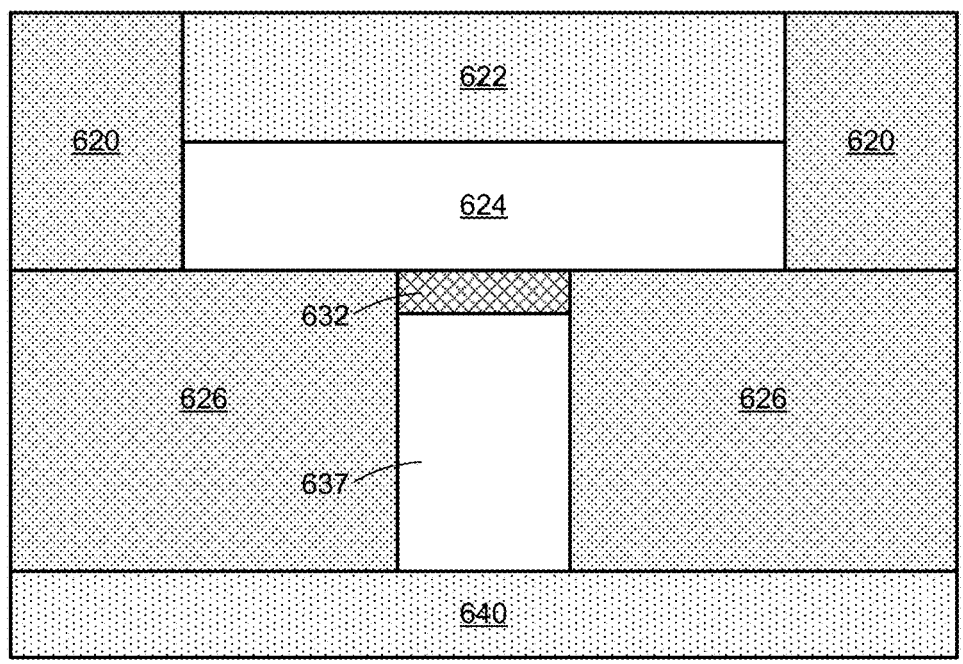

FIG. 6B depicts a cross-sectional view of a memory structure that includes a phase change material 624 in series with a heating element that comprises one or more conducting layers 632 and 637. The memory structure of FIG. 6B may correspond with a memory cell within a memory array, such as memory array 501 in FIG. 5. The memory structure of FIG. 6B differs from that depicted in FIG. 6A in that the heating element comprises only two conducting layers 632 and 637. The layer thicknesses of the two conducting layers 632 and 637 positions the thermal barrier formed between the two conducting layers closer to the phase change material 624 than the bottom electrode 640. Positioning one or more thermal barriers closer to or near the interface between the heating element and the phase change material 624 may improve localized heating of the phase change material 624. In one embodiment, the two conducting layers 632 and 637 may be deposited using the same electrically conductive material or compound (e.g., titanium nitride or aluminum nitride) but using different deposition conditions or process conductions, such as different deposition temperatures, carrier gas pressures, flow rates, and/or film thicknesses. In one example, the conducting layer 632 may be deposited above the conducting layer 637 using a different type of deposition technique; the conducting layer 632 may be deposited using ALD and the conducting layer 637 may be deposited using PVD. In another example, the conducting layer 632 may be deposited above the conducting layer 637 using ALD at a first temperature and the conducting layer 637 may be deposited using ALD at a second temperature different from the first temperature (e.g., greater than the first temperature).

Figure 6C:
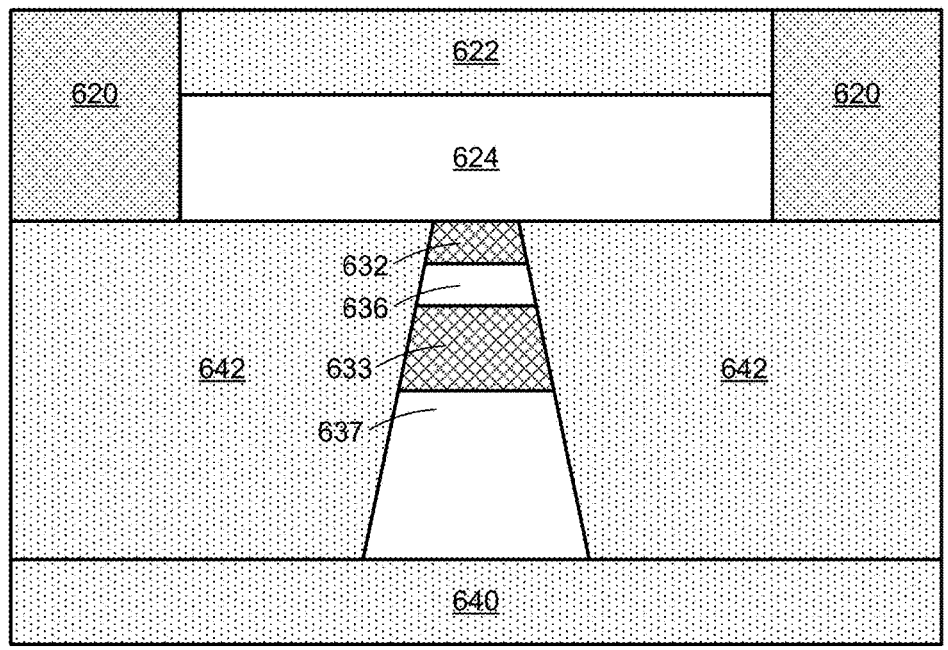

FIG. 6C depicts a cross-sectional view of a memory structure that includes a phase change material 624 in series with a heating element that comprises one or more conducting layers 632-633 and 636-637. The memory structure of FIG. 6C may correspond with a memory cell within a memory array, such as memory array 501 in FIG. 5. The memory structure of FIG. 6C differs from that depicted in FIG. 6A in that the heating element layers each have different widths. In this case, the current crowding through the heating element may be further enhanced as the width of the conducting layer 632 is less than the width of the conducting layer 636. In one example, the tapered profile may be created by depositing the conducting layers of the heating element first and then performing an isotropic etch to remove portions of the conducting layers and then depositing an oxide layer, such as oxide layer 642.

Figure 6D:
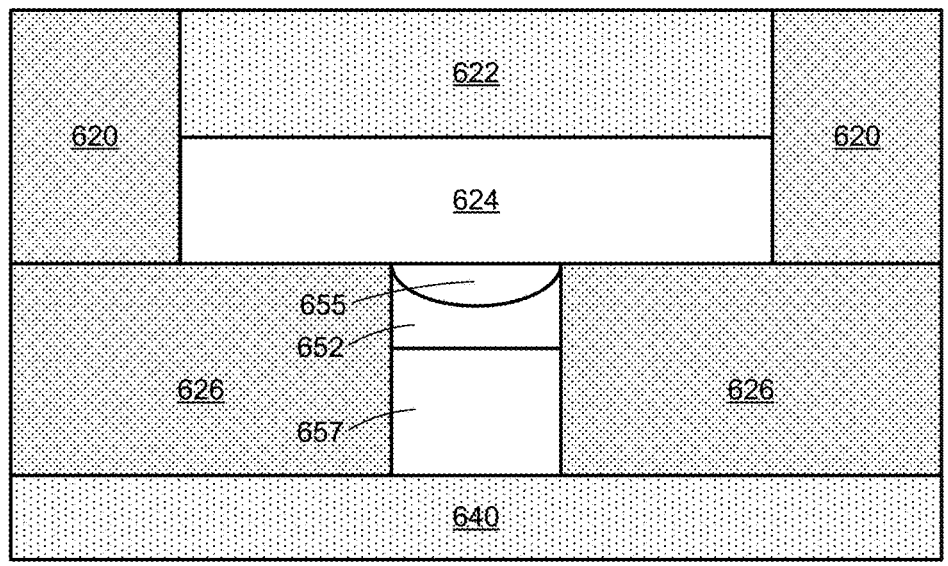

FIG. 6D depicts a cross-sectional view of a memory structure that includes a phase change material 624 in series with a heating element that comprises one or more conducting layers 652, 655 and 657. The memory structure of FIG. 6D may correspond with a memory cell within a memory array, such as memory array 501 in FIG. 5. The memory structure of FIG. 6D differs from that depicted in FIG. 6A in that the heating element layers include a non-planar conducting layer 655. In one example, an isotropic etch may be used to etch a non-uniform trench within a portion of the conducting layer 652 and then the conducting layer 655 may be deposited within the non-uniform trench (or hole). In this case, the thermal barrier between the conducting layer 655 and the conducting layer 652 may form a U-shape in two-dimensions or a bowl shape in three-dimensions to help further concentrate current flow within the heating element and to improve the localized heating of the phase change material 624.

Figure 6E:
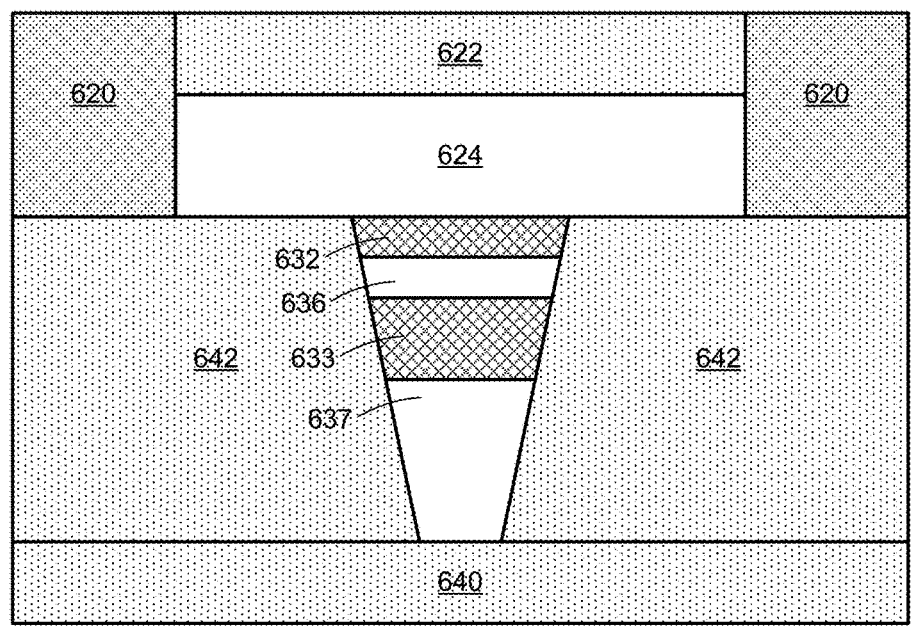

FIG. 6E depicts a cross-sectional view of a memory structure that includes a phase change material 624 in series with a heating element that comprises one or more conducting layers 632-633 and 636-637. The memory structure of FIG. 6E may correspond with a memory cell within a memory array, such as memory array 501 in FIG. 5. The memory structure of FIG. 6E differs from that depicted in FIG. 6A in that the heating element layers each have different widths. As depicted, the width of the conducting layer 632 is greater than the width of the conducting layer 636 and the width of the conducting layer 633 is greater than the width of the conducting layer 637. In one example, the tapered profile may be created by depositing an oxide layer, such as oxide layer 642, and then performing an isotropic etch to remove portions of the oxide layer to form a tapered trench or hole and then depositing the conducting layers of the heating element within the etched trench or hole. In some cases, a diode (e.g., a p-n junction diode) or a non-ohmic device (e.g., a metal-insulator-metal diode) may be deposited within a bottom portion of the etched trench or hole below the plurality of conducting layers in order to form a selector device or a steering device in series with the heating element. Thus, the non-ohmic device or diode may be integrated with the heating element within the etched trench or hole.

Figure 7A:
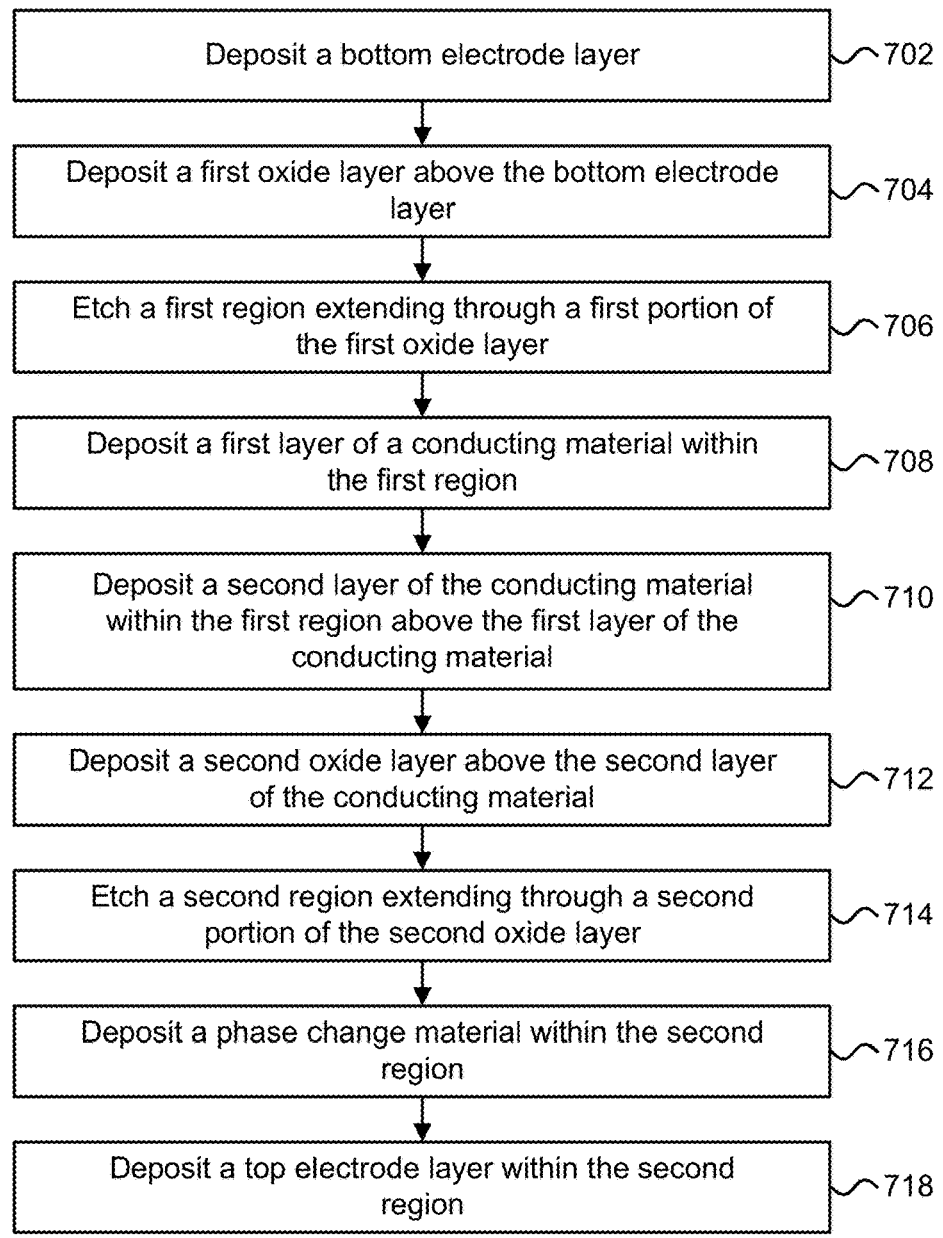
FIG. 7A depicts a flowchart describing one embodiment of a process for fabricating a memory structure.

FIG. 7A depicts a flowchart describing one embodiment of a process for fabricating a memory structure. The flowchart may omit common processing steps (e.g., the formation of isolation regions or structures, various implant and annealing steps, the formation of vias/contacts, the formation of a passivation layer, hard mask patterning and removal, cleaning, planarization, etc.) in order to highlight the processing steps described.

In step 702, a bottom electrode layer is deposited above a substrate (e.g., a silicon substrate). The bottom electrode layer may comprise a layer of tungsten or aluminum. In step 704, a first oxide layer is deposited above the bottom electrode layer. The first oxide layer may comprise a layer of silicon dioxide. In step 706, a first region is etched extending through a first portion of the first oxide layer. The first region may be etched by patterning and then removing material using various etching techniques such as dry etching, wet chemical etching, plasma etching, or reactive-ion etching (RIE). The first region may correspond with a hole or trench within the first oxide layer in which a heating element may be formed.

In step 708, a first layer of a conducting material is deposited within the first region. One example of the first layer of the conducting material is conducting layer 636 in FIG. 6A. In step 710, a second layer of the conducting material is deposited within the first region above the first layer of the conducting material. One example of the second layer of the conducting material is conducting layer 632 in FIG. 6A. The second layer of the conducting material may abut the first layer of the conducting material or be formed directly above or on top of the first layer of the conducting material.

In one embodiment, the conducting material may comprise titanium nitride or aluminum nitride and the first layer of the conducting material may be deposited using ALD, while the second layer of the conducting material may be deposited using PVD. In another embodiment, the conducting material may comprise aluminum nitride or titanium nitride and the first layer of the conducting material may be deposited using a first deposition temperature and the second layer of the conducting material may be deposited using a second deposition temperature different from the first deposition temperature (e.g., greater than the first deposition temperature). In another embodiment, the conducting material may comprise a metal nitride and the first layer of the conducting material may be deposited using a first gas pressure and the second layer of the conducting material may be deposited using a second gas pressure different from the first gas pressure (e.g., greater than the first gas pressure). In some cases, the first layer of the conducting material may have a layer thickness of 5 nm and the second layer of the conducting material may have a layer thickness of 10 nm or 20 nm.

In step 712, a second oxide layer is deposited above the second layer of the conducting material. One example of the second oxide layer is oxide layer 620 in FIG. 6A. In step 714, a second region extending through a second portion of the second oxide layer is etched. The second region may be etched by patterning and then removing material using various etching techniques such as dry etching, wet chemical etching, plasma etching, or reactive-ion etching (RIE). The second region may correspond with a hole or trench within the second oxide layer in which a phase change material may be deposited. In step 716, a phase change material is deposited within the second region. In step 718, a top electrode layer is deposited within the second region or above the phase change material. One example of the top electrode layer is the top electrode 622 in FIG. 6A. In some embodiments, the top electrode layer may correspond with a bit line layer and the bottom electrode layer may correspond with a word line layer. In other embodiments, the top electrode layer may correspond with a word line layer and the bottom electrode layer may correspond with a bit line layer.

Figure 7B:
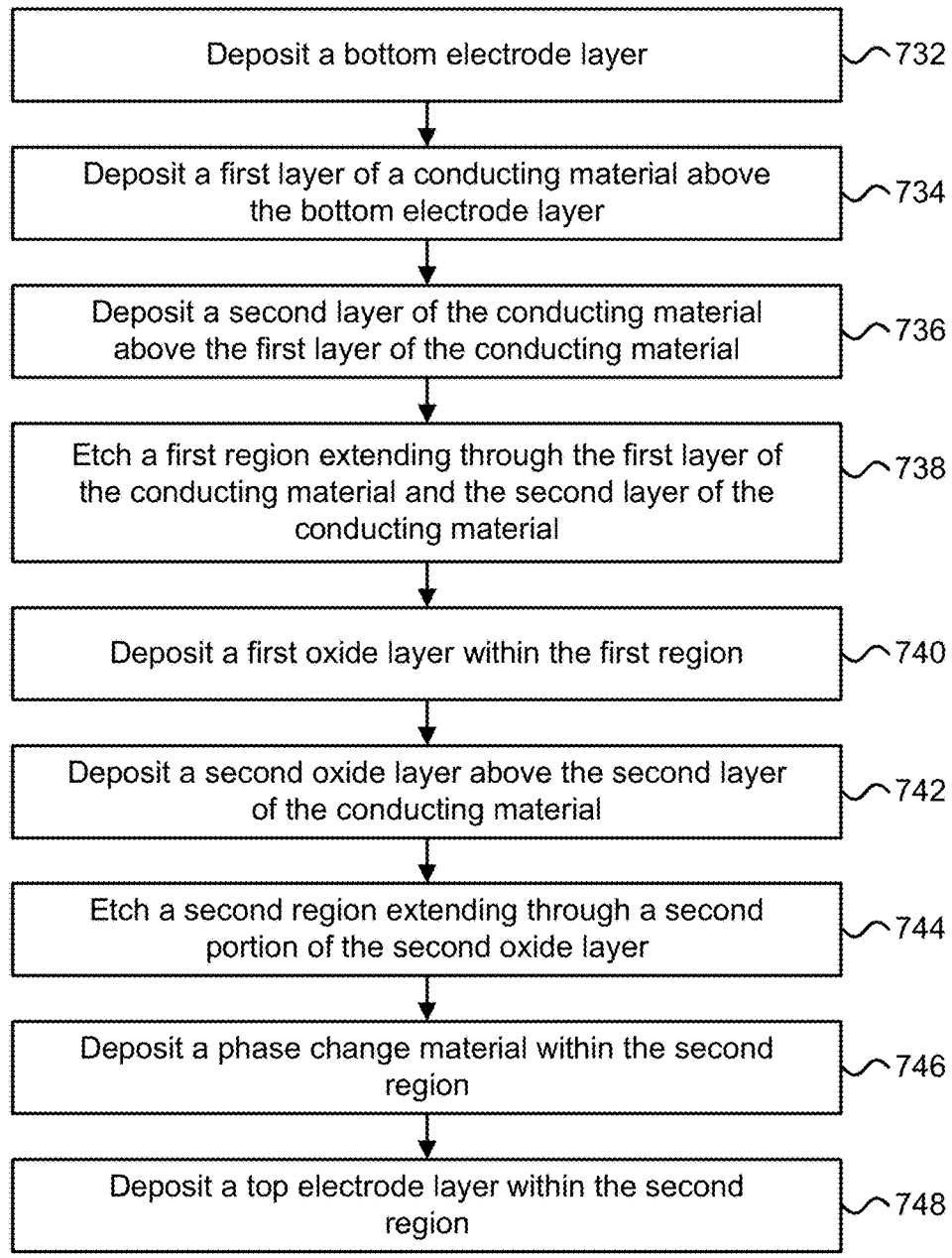
FIG. 7B depicts a flowchart describing another embodiment of a process for fabricating a memory structure.

FIG. 7B depicts a flowchart describing another embodiment of a process for fabricating a memory structure. The flowchart may omit common processing steps (e.g., the formation of isolation regions or structures, various implant and annealing steps, the formation of vias/contacts, the formation of a passivation layer, hard mask patterning and removal, cleaning, planarization, etc.) in order to highlight the processing steps described.

In step 732, a bottom electrode layer is deposited above a substrate (e.g., a silicon substrate). The bottom electrode layer may comprise a layer of tungsten. In step 734, a first layer of a conducting material is deposited above the bottom electrode layer. In step 736, a second layer of the conducting material is deposited above the first layer of the conducting material. One example of the first layer of the conducting material is conducting layer 636 in FIG. 6A and one example of the second layer of the conducting material is conducting layer 632 in FIG. 6A. The second layer of the conducting material may abut the first layer of the conducting material or be formed directly above or on top of the first layer of the conducting material.

In step 738, a first region extending through the first layer of the conducting material and the second layer of the conduct material is etched. The first region may be etched by patterning and then removing material using various etching techniques such as dry etching, wet chemical etching, plasma etching, or reactive-ion etching (ME). The etching of the first region may cause heating element pillars to be formed. In one example, the heating element pillar may correspond with the pillar of conducting layers 632-633 and 636-637 in FIG. 6A.

In one embodiment, the conducting material may comprise titanium nitride or aluminum nitride and the first layer of the conducting material may be deposited using ALD, while the second layer of the conducting material may be deposited using ALD or PVD. In another embodiment, the conducting material may comprise aluminum nitride or titanium nitride and the first layer of the conducting material may be deposited using a first deposition temperature or pressure and the second layer of the conducting material may be deposited using a second deposition temperature or pressure different from the first deposition temperature or pressure. In another embodiment, the conducting material may comprise a metal nitride and the first layer of the conducting material may be deposited using a first gas pressure and the second layer of the conducting material may be deposited using a second gas pressure different from the first gas pressure (e.g., greater than the first gas pressure). In some cases, the first layer of the conducting material may have a layer thickness of 3 nm and the second layer of the conducting material may have a layer thickness of 5 nm or 10 nm.

In step 740, a first oxide layer is deposited within the first region. The first oxide layer may comprise a layer of silicon dioxide. The first oxide layer may correspond with oxide layer 626 in FIG. 6A. In step 742, a second oxide layer is deposited above the second layer of the conducting material or above the first oxide layer. One example of the second oxide layer is oxide layer 620 in FIG. 6A. In step 744, a second region extending through a second portion of the second oxide layer is etched. The second region may be etched by patterning and then removing material using various etching techniques such as dry etching, wet chemical etching, plasma etching, or reactive-ion etching (RIE). The second region may correspond with a hole or trench within the second oxide layer in which a phase change material may be deposited. In step 746, a phase change material is deposited within the second region. In step 748, a top electrode layer is deposited within the second region or above the phase change material. One example of the top electrode layer is the top electrode 622 in FIG. 6A. In some embodiments, the top electrode layer may correspond with a bit line layer and the bottom electrode layer may correspond with a word line layer. In other embodiments, the top electrode layer may correspond with a word line layer and the bottom electrode layer may correspond with a bit line layer.

One embodiment of the disclosed technology includes a bit line, a word line, and a memory cell arranged between the word line and the bit line. The memory cell includes a layer of a phase change material directly connected to a first layer of a conducting material. The first layer of the conducting material deposited with a first set of deposition conditions. The first layer of the conducting material is directly connected to a second layer of the conducting material. The second layer of the conducting material deposited with a second set of deposition conditions different from the first set of deposition conditions.

One embodiment of the disclosed technology includes one or more control circuits for controlling a memory array including a word line and a bit line. The memory array includes a memory cell arranged between the word line and the bit line. The memory cell includes a layer of a phase change material deposited over and abutting a first layer of a conducting material. The first layer of the conducting material deposited with a first set of deposition conditions. The first layer of the conducting material deposited over and abutting a second layer of the same conducting material. The second layer of the conducting material deposited with a second set of deposition conditions different from the first set of deposition conditions. The conducting material comprises a metal nitride, such as titanium nitride. The one or more control circuits configured to bias the word line and the bit line during a memory operation.

One embodiment of the disclosed includes forming a first oxide layer above a substrate, etching a first region extending through a first portion of the first oxide layer, depositing a first layer of a conducting material within the first region using a first set of deposition conditions, depositing a second layer of the same conducting material within the first region directly above the first layer of the conducting material using a second set of deposition conditions, depositing a second oxide layer above the second layer of the conducting material, etching a second region extending through a second portion of the second oxide layer, and depositing a phase change material within the second region directly above the second layer of the conducting material. The phase change material has a first width and the first layer of the conducting material has a second width less than the first width.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A memory structure, comprising:
   a bit line;
   a word line; and
   a memory cell arranged between the word line and the bit line, the memory cell includes a layer of a phase change material directly connected to a first layer of a conducting material at a first interface of a first width, the first layer of the conducting material deposited with a first set of deposition conditions, the first layer of the conducting material is directly connected to a second layer of the conducting material at a second interface of a second width less than the first width, the second layer of the conducting material deposited with a second set of deposition conditions different from the first set of deposition conditions.

2. The memory structure of claim 1, wherein:
the first set of deposition conditions corresponds with an atomic layer deposition process and the second set of deposition conditions corresponds with a physical vapor deposition process.

3. The memory structure of claim 1, wherein:
the first set of deposition conditions corresponds with the deposition of the first layer of the conducting material over the second layer of the conducting material at a first temperature and the second set of deposition conditions corresponds with the deposition of the second layer of the conducting material at a second temperature different from the first temperature.

4. The memory structure of claim 1, wherein:
the first set of deposition conditions corresponds with depositing the first layer of the conducting material over the second layer of the conducting material at a first gas pressure and the second set of deposition conditions corresponds with depositing the second layer of the conducting material at a second gas pressure different from the first gas pressure.

5. The memory structure of claim 1, wherein:
the first set of deposition conditions corresponds with depositing the first layer of the conducting material over the second layer of the conducting material with a first percentage of nitrogen gas and the second set of deposition conditions corresponds with depositing the second layer of the conducting material with a second percentage of nitrogen gas different from the first percentage of nitrogen gas.

6. The memory structure of claim 1, wherein:
the conducting material comprises a metal nitride.

7. The memory structure of claim 6, wherein:
the metal nitride comprises titanium nitride; and
the phase change material comprises a germanium-antimony-tellurium compound.

8. The memory structure of claim 1, wherein:
the layer of the phase change material has a first layer thickness; and
the first layer of the conducting material has a second layer thickness less than the first layer thickness.

9. The memory structure of claim 8, wherein:
the second layer of the conducting material has a third layer thickness greater than the second layer thickness.

10. The memory structure of claim 1, wherein:
the first layer of the conducting material has a first layer thickness; and
the second layer of the conducting material has a second layer thickness greater than the first layer thickness.

11. The memory structure of claim 1, further comprising:
a diode arranged in series with the memory cell between the bit line and the word line.

12. An apparatus, comprising:
a memory array including a word line and a bit line, the memory array includes a memory cell arranged between the word line and the bit line, the memory cell includes a layer of a phase change material deposited over and abutting a first layer of a metal nitride at a first interface of a first width, the first layer of the metal nitride deposited with a first set of deposition conditions, the first layer of the metal nitride deposited over and abutting a second layer of the same metal nitride at a second interface of a second width less than the first width, the second layer of the metal nitride deposited with a second set of deposition conditions different from the first set of deposition conditions; and
one or more control circuits configured to bias the word line and the bit line during a memory operation.

13. The apparatus of claim 12, wherein:
the first set of deposition conditions corresponds with an atomic layer deposition process and the second set of deposition conditions corresponds with a chemical vapor deposition process.

14. The apparatus of claim 12, wherein:
the first set of deposition conditions corresponds with depositing the first layer of the metal nitride over the second layer of the metal nitride at a first deposition temperature and the second set of deposition conditions corresponds with depositing the second layer of the metal nitride at a second deposition temperature different from the first deposition temperature.

15. The apparatus of claim 12, wherein:
the metal nitride comprises one of titanium nitride or aluminum nitride; and
the phase change material comprises a germanium-antimony-tellurium compound.

16. The apparatus of claim 12, wherein:
the layer of the phase change material has a first layer thickness;
the first layer of the metal nitride has a second layer thickness less than the first layer thickness; and
the second layer of the metal nitride has a third layer thickness greater than the second layer thickness.

17. The apparatus of claim 12, wherein:
the first layer of the metal nitride has a first layer thickness; and
the second layer of the metal nitride has a second layer thickness greater than the first layer thickness.

18. The apparatus of claim 12, further comprising:
a non-ohmic device arranged in series with the memory cell between the bit line and the word line, the memory operation comprises a programming operation.

* * * * *